(12) United States Patent
Eun

(10) Patent No.: US 9,054,306 B2
(45) Date of Patent: Jun. 9, 2015

(54) METHODS OF MANUFACTURING A PHASE CHANGE MEMORY DEVICE

(71) Applicant: Samsung Electronics Co., Ltd., Suwon-Si, Gyeonggi-Do (KR)

(72) Inventor: Seong-Ho Eun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/904,665

(22) Filed: May 29, 2013

(65) Prior Publication Data

US 2014/0004680 A1    Jan. 2, 2014

(30) Foreign Application Priority Data

Jul. 2, 2012 (KR) .................. 10-2012-0071592

(51) Int. Cl.
*H01L 21/20* (2006.01)
*H01L 45/00* (2006.01)
*H01L 27/24* (2006.01)

(52) U.S. Cl.
CPC ............ *H01L 45/1608* (2013.01); *H01L 45/06* (2013.01); *H01L 45/1233* (2013.01); *H01L 45/144* (2013.01); *H01L 45/1683* (2013.01); *H01L 27/2409* (2013.01); *H01L 27/2463* (2013.01)

(58) Field of Classification Search
CPC . H01L 45/1608; H01L 45/1683; H01L 45/06; H01L 45/1233; H01L 45/144; H01L 27/2409; H01L 27/2463
USPC ........................................................ 438/382
See application file for complete search history.

(56) References Cited

U.S. PATENT DOCUMENTS

| | | | |
|---|---|---|---|
| 7,482,616 B2 | 1/2009 | Song et al. | |
| 2007/0069249 A1 | 3/2007 | Hayakawa | |
| 2007/0160760 A1* | 7/2007 | Shin et al. ............... | 427/255.35 |
| 2009/0250680 A1 | 10/2009 | Takaura et al. | |
| 2010/0108970 A1 | 5/2010 | Liu et al. | |
| 2010/0190321 A1* | 7/2010 | Oh et al. ...................... | 438/478 |
| 2010/0203672 A1* | 8/2010 | Eun et al. ..................... | 438/102 |
| 2010/0327249 A1 | 12/2010 | Choi et al. | |

FOREIGN PATENT DOCUMENTS

| | | |
|---|---|---|
| KR | 20090117233 A | 11/2009 |
| KR | 10-1058497 B1 | 8/2010 |

* cited by examiner

*Primary Examiner* — Reema Patel
*Assistant Examiner* — Syed Gheyas
(74) *Attorney, Agent, or Firm* — Harness, Dickey & Pierce, P.L.C.

(57) ABSTRACT

A method of manufacturing a phase change memory device includes forming a lower electrode in a cell region of a substrate and a transistor in a peripheral circuit region of the substrate. A first insulating interlayer is formed on the substrate and covers the lower electrode and the transistor. A first contact is formed to penetrate through the first insulating interlayer to connect with the transistor. A second insulating interlayer is formed on the first insulating interlayer and the first contact. A first opening and a second opening are formed by partially removing the first and second insulating interlayers. A phase change material layer pattern is formed to partially fill the first opening. A bit line is formed to fill a remaining portion of the first opening, and a wiring is formed to fill the second opening. Accordingly, the manufacturing process may be simplified.

20 Claims, 16 Drawing Sheets

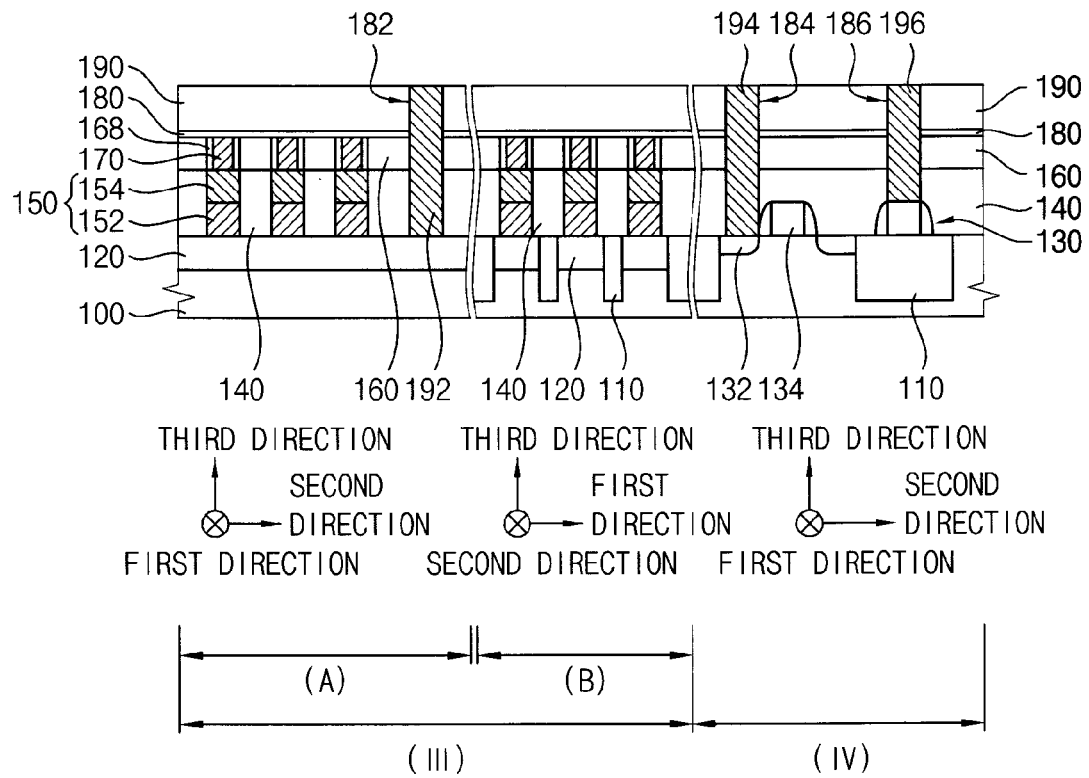
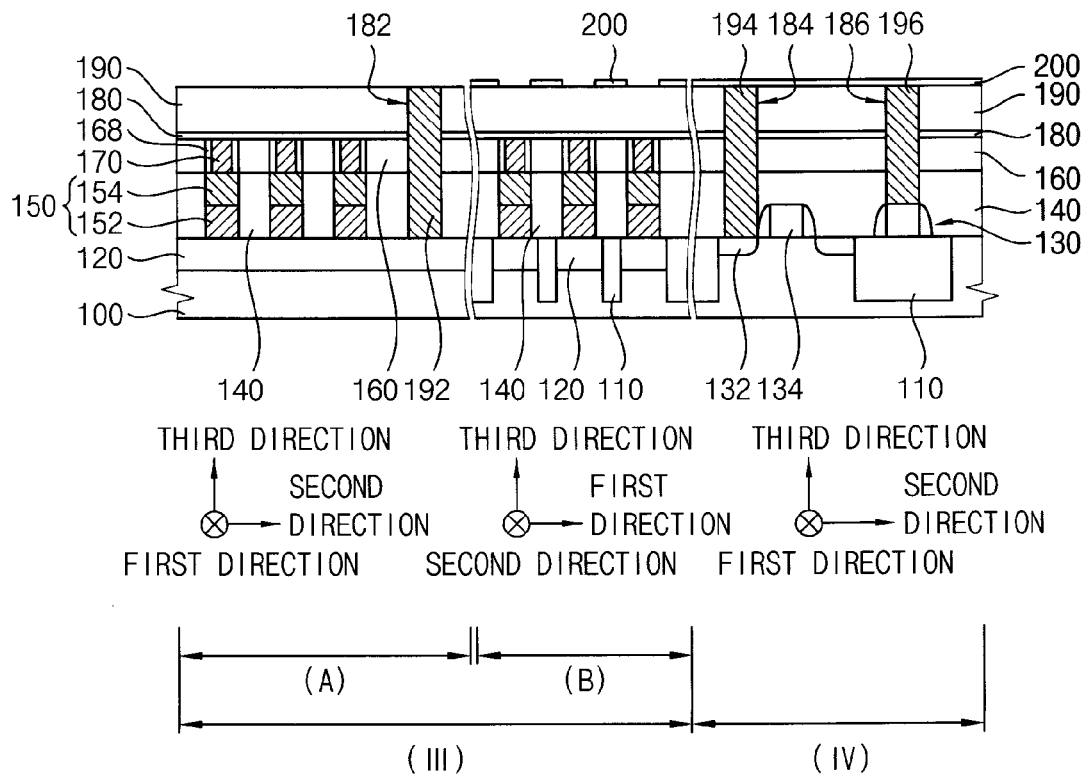

FIG. 13
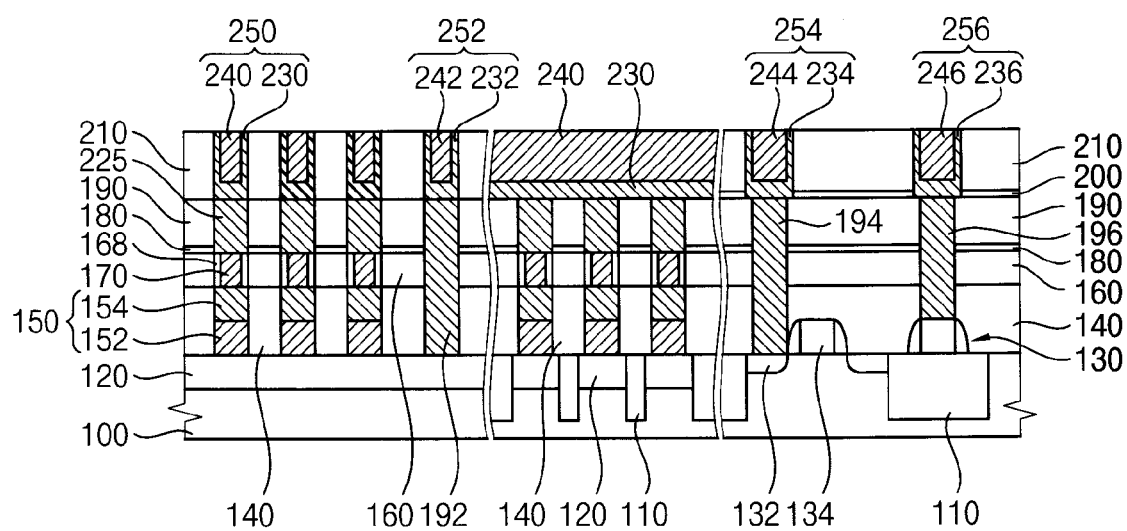
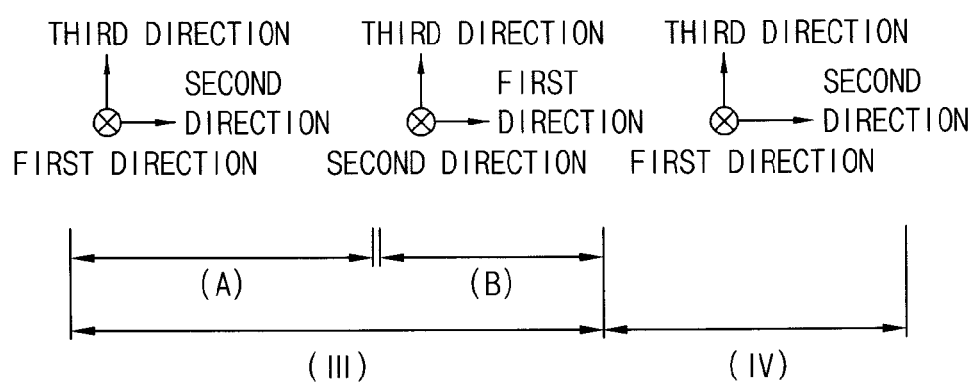

FIG. 15
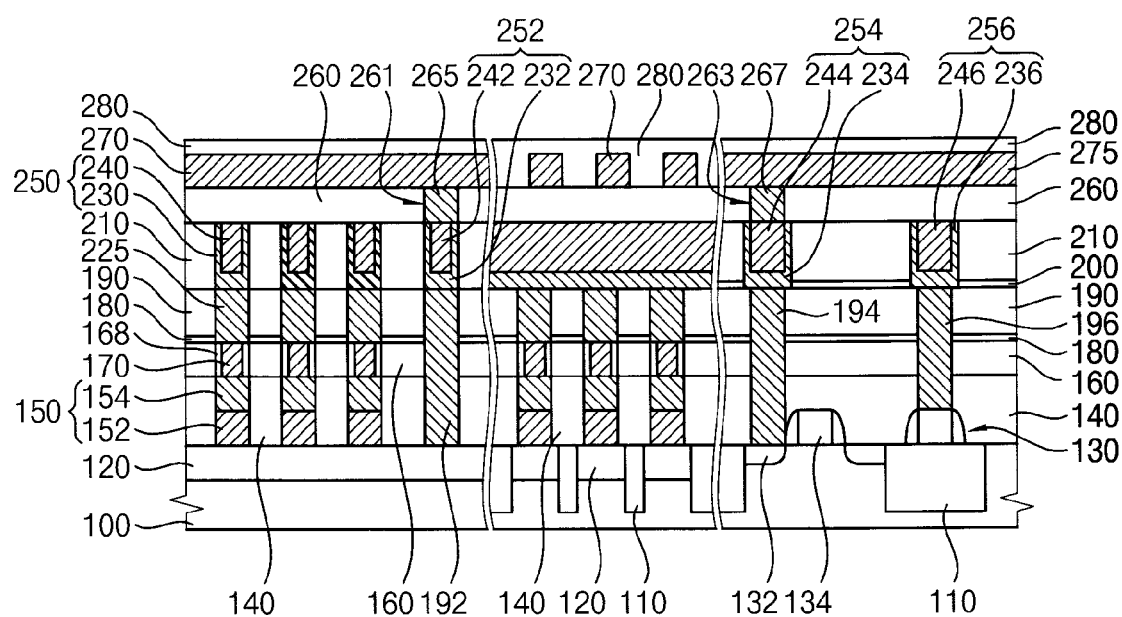
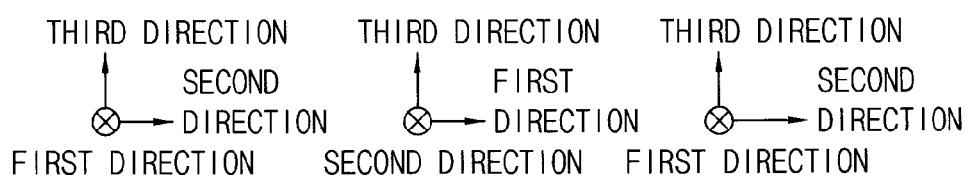
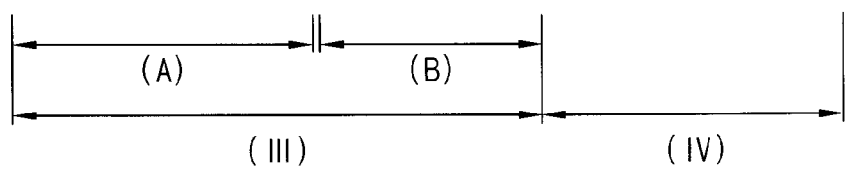

FIG. 19
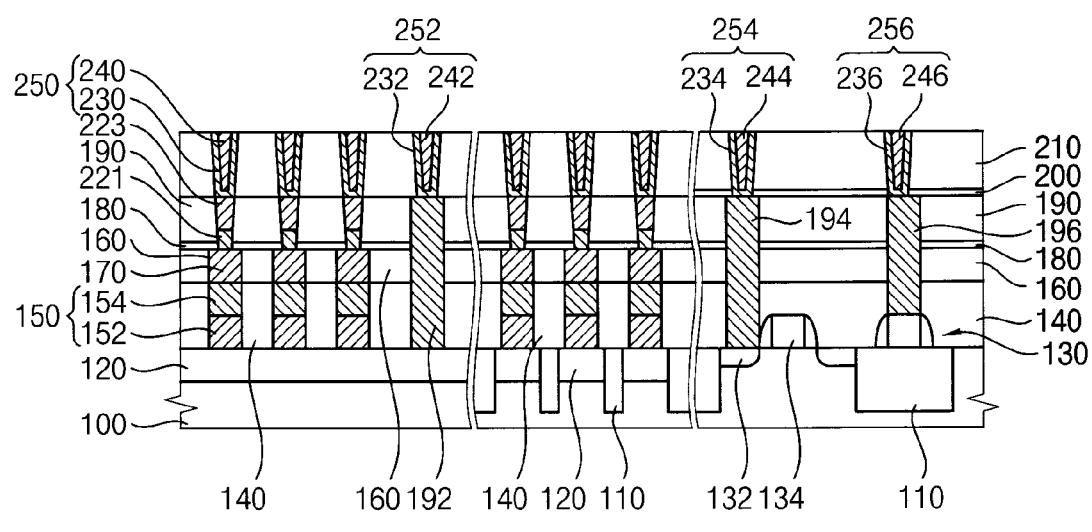
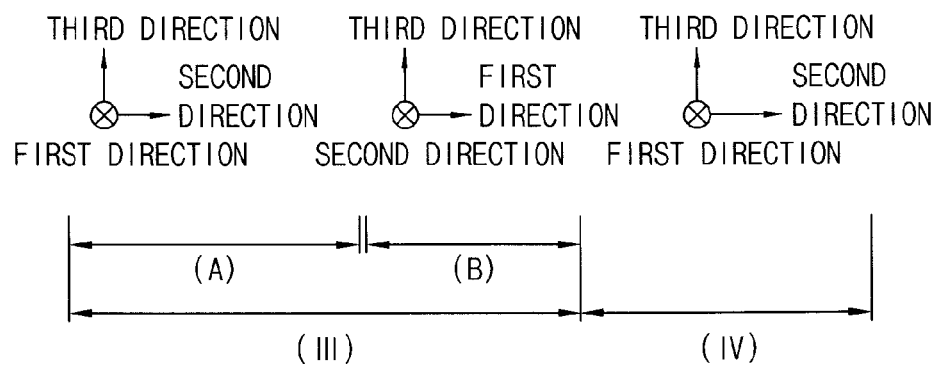

METHODS OF MANUFACTURING A PHASE CHANGE MEMORY DEVICE

CROSS-REFERENCE TO RELATED APPLICATION

This application claims priority under 35 USC §119 to Korean Patent Application No. 10-2012-0071592 filed on Jul. 2, 2012 in the Korean Intellectual Property Office (KIPO), the entire disclosure of which is incorporated herein by reference.

BACKGROUND

1. Field

At least one example embodiment relates to a method(s) of manufacturing a phase change memory device.

2. Description of the Related Art

A phase change memory device is a device for storing data using a resistance change generated by a phase transition between an amorphous state and a crystalline state of a phase change material layer pattern.

The phase change memory device generally includes a lower electrode, a phase change material layer pattern, an upper electrode and a bit line. In the method of manufacturing the phase change memory device, the processes for forming the phase change material layer pattern, the upper electrode and the bit line may be conducted separately. Accordingly, the manufacturing process may become complicated, and a correct alignment of the phase change material layer pattern with the upper electrode and/or the bit line may become difficult.

SUMMARY

At least one example embodiment provides a simplified method of manufacturing a phase change memory device.

At least one example embodiment provides a simplified method of manufacturing a semiconductor device having improved reliability and/or lifetime.

According to at least one example embodiment, a method of manufacturing a phase change memory device includes forming a lower electrode in a cell region of a substrate and a transistor in a peripheral circuit region of the substrate. The method includes forming a first insulating interlayer on the substrate, the first insulating interlayer covering the lower electrode and the transistor. The method includes forming a first contact in the peripheral circuit region, the first contact penetrating through the first insulating interlayer to make an electric connection with the transistor. The method also includes forming a second insulating interlayer on the first insulating interlayer and the first contact. The method further includes forming a first opening and a second opening by partially removing the first and second insulating interlayers, the first opening exposing the lower electrode and the second opening exposing the first contact. The method further includes forming a phase change material layer to fill the first and second openings. The method includes partially removing the phase change material layer to form a phase change material layer pattern partially filling the first opening. The method further includes forming a bit line and a wiring, the bit line filling a remaining portion of the first opening, and the wiring filling the second opening.

According to at least one example embodiment, the bit line is formed to extend in a first direction parallel to an upper surface of the substrate.

According to at least one example embodiment, the method includes forming a word line extending in a second direction in the cell region of the substrate, the second direction being perpendicular to the first direction.

According to at least one example embodiment, forming the first contact further comprises forming a second contact through the first insulating interlayer to make an electric connection with the word line in the cell region of the substrate.

According to at least one example embodiment, forming the first opening further comprises forming a third opening exposing the second contact, forming the phase change material layer further comprises forming the phase change material layer to fill the third opening, and forming the bit line and the wiring further comprises forming a word line contact to fill the third opening.

According to at least one example embodiment, partially removing the phase change material layer includes partially removing a portion of the phase change material layer which fills the first opening, and removing portions of the phase change material layer which fills the second opening.

According to at least one example embodiment, partially removing the phase change material layer includes an etch back process.

According to at least one example embodiment, forming the bit line and the wiring includes forming a first barrier layer on the phase change material layer pattern, the first contact, side walls of the first and second openings, and the second insulating interlayer and forming a first conductive layer on the first barrier layer, the first conductive layer filling a remaining portion of the first and second openings. Forming the bit line and the wiring also includes planarizing the first conductive layer and the first barrier layer until the upper surface of the second insulating interlayer is exposed to form a first barrier layer pattern and a first conductive pattern partially filling up the first opening, and to form a second barrier layer pattern and a second conductive pattern filling up the second opening.

According to at least one example embodiment, the bit line directly contacts the phase change material layer pattern.

According to at least one example embodiment, the method further includes forming an etch stopping layer on the first insulating interlayer after forming the first insulating interlayer.

According to at least one example embodiment, the method further includes forming a diode in the cell region of the substrate before forming the lower electrode, wherein the lower electrode is formed on the diode.

According to at least one example embodiment, the phase change material layer pattern is self-aligned with the bit line.

According to at least one example embodiment, a method of manufacturing a phase change memory device includes forming a lower electrode in a cell region of a substrate and a transistor in a peripheral circuit region of the substrate, and forming a first insulating interlayer on the substrate, the first insulating interlayer covering the lower electrode and the transistor. The method includes forming a first contact in the peripheral circuit region, the first contact penetrating through the first insulating interlayer to make an electric connection with the transistor. The method includes forming a second insulating interlayer on the first insulating interlayer and the first contact. The method further includes forming a first opening and a second opening by partially removing the first and second insulating interlayers, the first opening exposing the lower electrode and the second opening exposing the first contact. The method also includes forming a lower phase change material layer filling up the first and second openings. The method includes forming a lower phase change material layer pattern by partially removing the lower phase change material layer, the lower phase change material layer pattern partially filling up the first opening. The method includes forming an upper phase change material layer filling up the first and second openings. The method includes forming an upper phase change material layer pattern by partially removing the upper phase change material layer, the upper phase change material layer pattern partially filling up the first opening. The method also includes forming a bit line and a wiring, the bit line filling up a remaining portion of the first opening, and the wiring filling up the second opening.

According to at least one example embodiment, the method further includes forming a word line in the cell region, the word line extending in a first direction that is in parallel with an upper surface of the substrate. The bit line is formed to extend in a second direction that is perpendicular to the first direction.

According to at least one example embodiment, forming the first contact further comprises forming a second contact through the first insulating interlayer to make an electric connection with the word line. Forming the first opening and the second opening further comprises forming a third opening exposing the second contact. Forming the lower phase change material layer further comprises forming the lower phase change material layer to fill the third opening. Forming the bit line and the wiring further comprises forming a word line contact to fill the third opening.

According to at least one example embodiment, a method of manufacturing a phase change memory device includes forming a first insulating interlayer on a substrate. The method includes forming at least one lower electrode in the first insulating interlayer. The method includes forming a second insulating interlayer on the first insulating interlayer and the at least one lower electrode. The method includes forming at least one contact through the first and second insulating interlayers. The method also includes forming a third insulating interlayer on the second insulating interlayer and the at least one contact. The method includes forming first and second openings through the second and third insulating interlayers. The first opening exposes the at least one lower electrode and the second opening exposes the at least one contact. The method includes forming at least one phase change material on the at least one lower electrode. The method includes forming at least one bit line and at least one wiring, the at least one bit line being in the first opening, and the at least one wiring being in the second opening.

According to at least one example embodiment, forming the at least one phase change material includes forming a lower phase change material in a lower portion of the first opening, and forming an upper phase change material on the lower phase change material. The upper phase change material may have a higher resistance than the lower phase change material.

According to at least one example embodiment, forming the first and second openings includes forming the first and second openings to have inclined sidewalls.

According to at least one example embodiment, forming the at least one lower electrode includes forming the at least one lower electrode in the first insulating interlayer such that the at least one lower electrode has an upper surface substantially coplanar with an upper surface of the first insulating interlayer. Forming the at least one contact includes forming the at least one contact such that an upper surface of the at least one contact is substantially coplanar with an upper surface of the second insulating interlayer. Forming the at least one phase change material includes forming the at least one phase change material such that the at least one phase change material has an upper surface substantially coplanar with the upper surface of the at least one contact.

According to at least one example embodiment, the method further includes forming at least one word line contact on the at least one contact such that an upper surface of the at least one word line contact is substantially coplanar with the upper surface of the third insulating interlayer. Forming the at least one bit line and the at least one wiring includes forming the at least one bit line and the at least one wiring such that an upper surface of the at least one bit line and the at least one wiring is substantially coplanar with an upper surface of the third insulating interlayer.

BRIEF DESCRIPTION OF THE DRAWINGS

Example embodiments will be more clearly understood from the following detailed description taken in conjunction with the accompanying drawings. FIGS. 1 to 20 represent non-limiting, example embodiments as described herein.

FIG. 1 is a plan view illustrating a phase change memory device in accordance with at least one example embodiment;

FIGS. 2 to 15 are cross-sectional views for explaining a method of manufacturing a phase change memory device in accordance with at least one example embodiment;

FIGS. 16 to 19 are cross-sectional views for explaining a method of manufacturing a phase change memory device in accordance with at least one other example embodiment; and FIG. 20 is a block diagram for explaining a system including a phase change memory device in accordance with at least one example embodiment.

DETAILED DESCRIPTION OF THE EXAMPLE EMBODIMENTS

Figure 1:
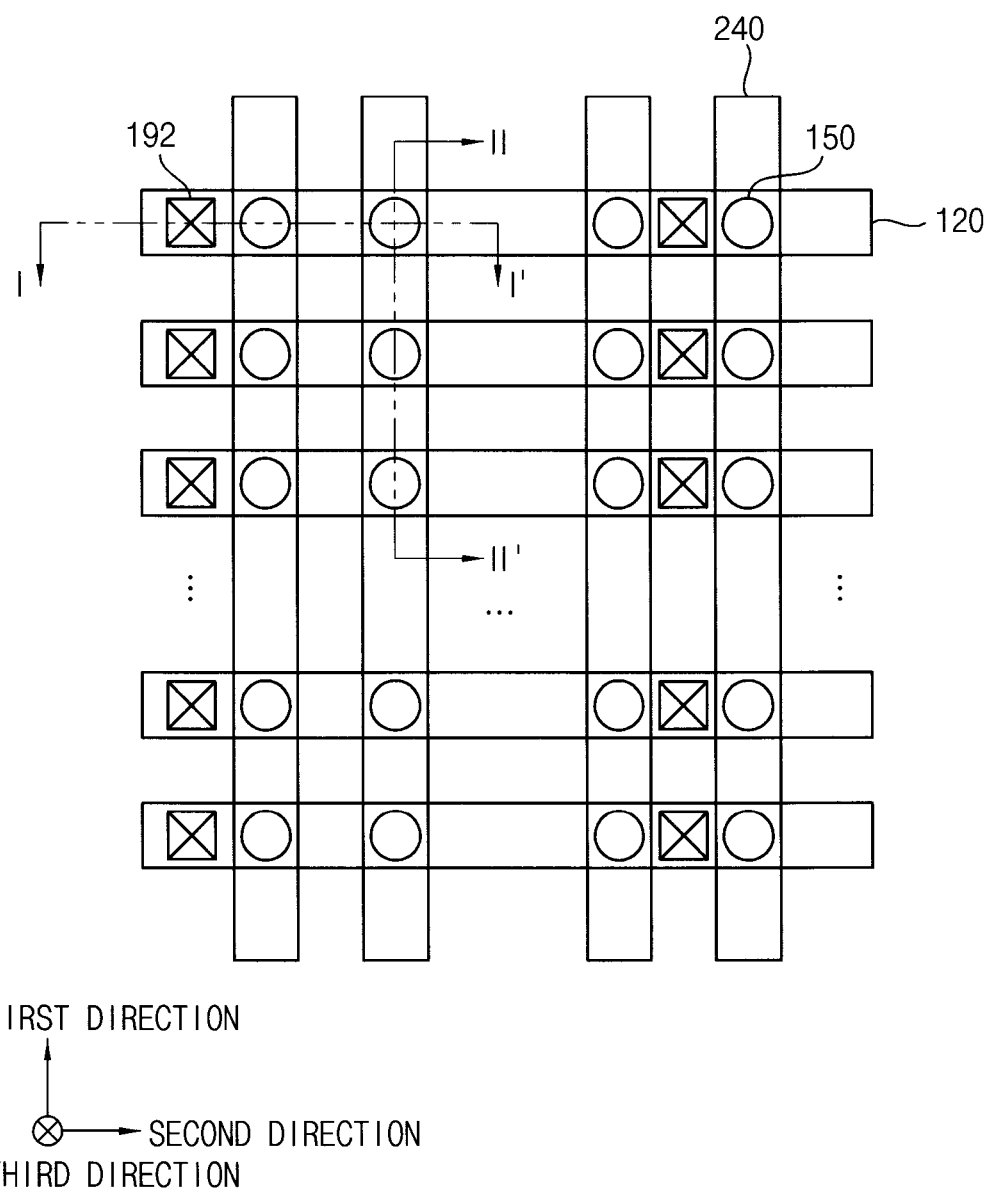

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

FIG. 1 is a plan view illustrating a phase change memory device in accordance with at least one example embodiment.

Referring to FIG. 1, a phase change memory device may include a plurality of bit lines (BL) 240 which may be formed to extend in a first direction, and may be arranged in parallel to one another in a second direction substantially perpendicular to the first direction, a plurality of impurity regions 120 which may be formed to extend in the second direction, and may be arranged in parallel to one another in the first direction, and a plurality of phase change memory cells defined at the cross regions of the bit lines 240 and the impurity regions 120. In this case, the impurity regions 120 may function as word lines (WL).

The phase change memory cell may include, for example, a phase change material layer pattern such as GST of which crystalline state may change reversibly by an electric signal such as a voltage or a current, or an optical signal. In addition, the phase change memory device may include a diode, a transistor, etc. as a switching device for selecting the phase change memory cell. In FIG. 1, a diode 150 may be illustrated as the switching device. Reference numeral 192 refers to a first contact making an electric connection with the word line.

FIGS. 2 to 15 are cross-sectional views for explaining a method of manufacturing a phase change memory device in accordance with at least one example embodiment. For the convenience of the explanation, a cross-section (A) taken along a line of I-I' in FIG. 1 and a cross-section (B) taken along a line of II-II' in FIG. 1 may be illustrated in FIGS. 2 to 15. In addition, the cross-section of a cell region (III) for disposing the phase change memory cells, and the cross-section of a peripheral circuit region (IV) for disposing peripheral circuits may be illustrated in FIGS. 2 to 15.

Figure 2:
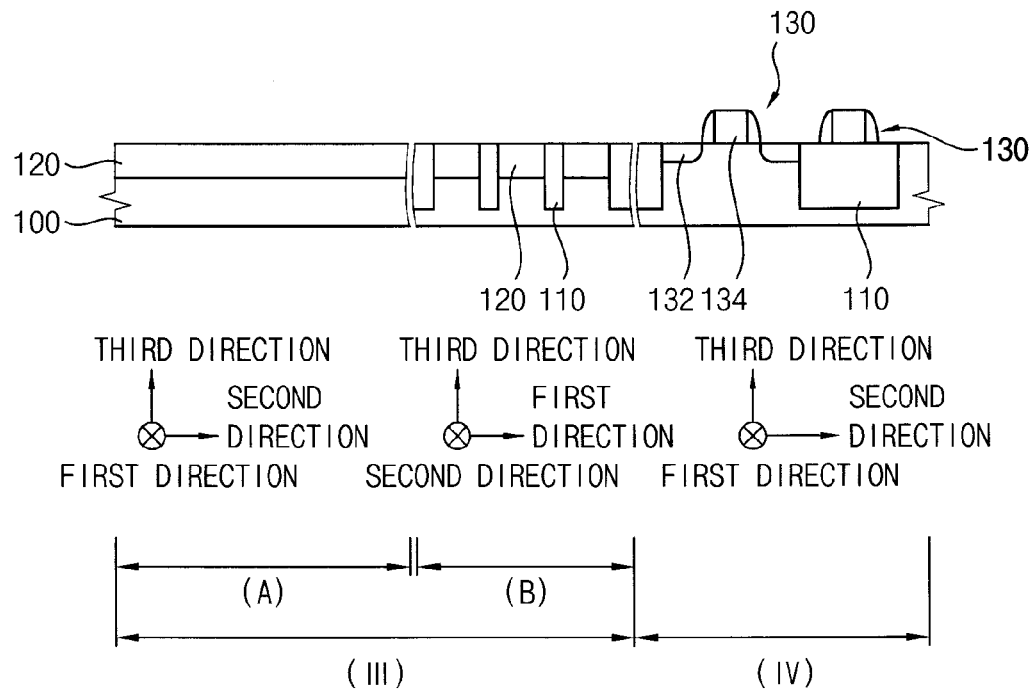

Referring to FIG. 2, after forming an isolation layer 110 on the upper portion of a substrate 100, first impurity regions 120 may be formed in the cell region (III), and a driving transistor 130 may be formed in the peripheral circuit region (IV).

The substrate 100 may include a semiconductor substrate. Particularly, the substrate 100 may include a silicon substrate, a germanium substrate, a silicon-germanium substrate, a silicon-on-insulator (SOI) substrate, a germanium-on-insulator substrate, etc.

The isolation layer 110 may be formed by a shallow trench isolation (STI) process. Particularly, after forming a first trench (not shown) at an upper portion of the substrate 100, an insulation layer filling the first trench may be formed on the substrate 100, and an upper portion of the insulation layer may be planarized to form the isolation layer 110. In example embodiments, the insulating layer may be formed using silicon oxide such as an MTO oxide, an HDP oxide, a CVD oxide. The planarizing process may be conducted by means of a chemical mechanical polishing (CMP) process and/or an etch back process.

In example embodiments, a plurality of the isolation layers 110 may be formed to extend in the second direction, and may be arranged in parallel to one another in the first direction. Through forming the isolation layer 110, the substrate 100 may be divided into a field region including the isolation layer 100 and an active region excluding the isolation layer 100.

Then, an ion doping process may be conducted into the upper portion of the substrate 100 in the cell region (III) to form the first impurity region 120. In example embodiments, a plurality of the first impurity regions 120 may be formed in the first direction, and each of the first impurity regions 120 may be extended in the second direction. Each of the first impurity regions 120 may function as the word line WL of the phase change memory device.

The driving transistor 130 may be formed in the peripheral circuit region (IV) of the substrate 100 before or after forming the first impurity region 120. Particularly, after depositing a silicon oxide layer (not illustrated) and polysilicon or a metallic thin layer (not illustrated) on the substrate 100, the silicon oxide layer and the polysilicon or the metallic thin layer may be patterned to form a gate structure 134. Second impurity regions 132 may be formed by doping ions into the upper portion of the substrate 100 adjacent to the gate structure 134.

The second impurity regions 132 may function as the source region or the drain region of the driving transistor 130.

Figure 3:
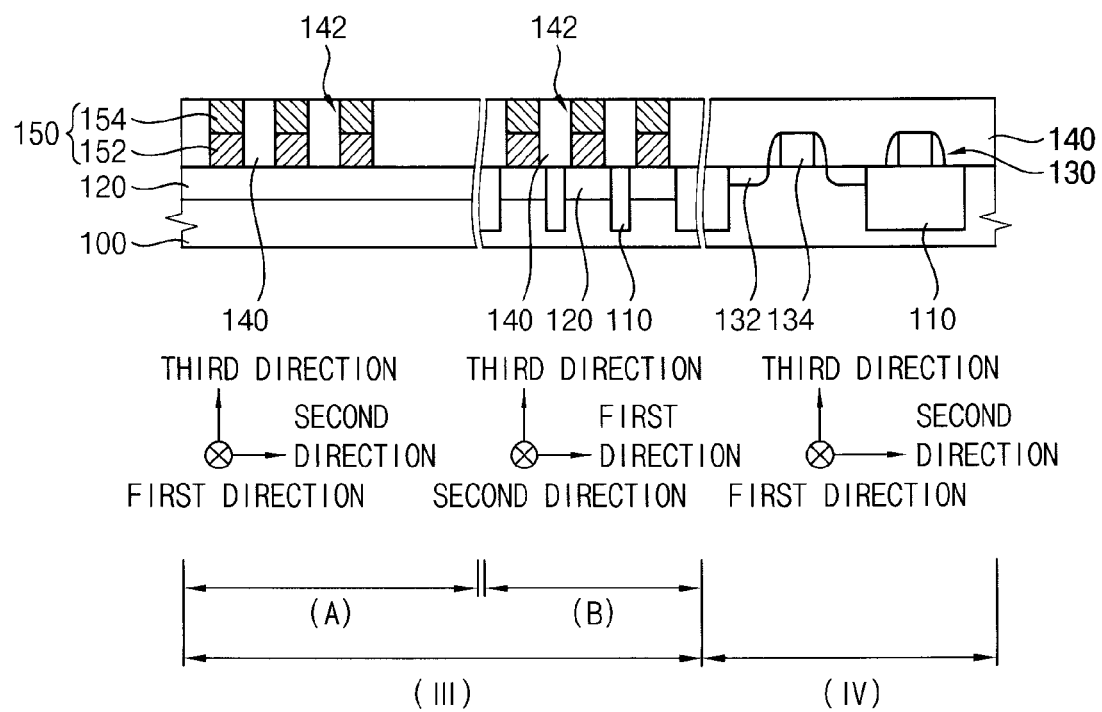

Referring to FIG. 3, a first insulating interlayer 140 covering the driving transistor 130 may be formed on the substrate 100 and the isolation layer 110, and a diode 150 may be formed through the first insulating interlayer 140.

The first insulating interlayer 140 may be formed using silicon oxide, silicon nitride, silicon oxynitride, etc. by means of a CVD process, a PECVD process, a spin coating process, an HDP-CVD process, etc. In at least one example embodiment, the first insulating interlayer 140 may be formed using silicon oxide.

After forming first holes 142 exposing the first impurity regions 120 by partially etching the first insulating interlayer 140, a conductive layer may be formed to fill up the first holes 142, and impurities may be doped into the conductive layer to form the diode 150.

The conductive layer may be formed by conducting a selective epitaxial growth (SEG) process using the exposed first impurity regions 120 as a seed. A planarizing process with respect to the upper portion of the conductive layer may be further conducted so that the height of the upper surface of the conductive layer and the upper surface of the first insulating interlayer 140 may become substantially the same (i.e., the planarizing process is performed such that the upper surface of the conductive layer and the upper surface of the first insulating interlayer 140 are substantially coplanar with one another).

In example embodiments, a first conductive pattern 152 may be formed by doping n-type impurities into the lower portion of the conductive layer, and a second conductive pattern 154 may be formed by doping p-type impurities into the upper portion of the conductive layer. Accordingly, the diode 150 may be formed to include the first and second conductive patterns 152 and 154 integrated one by one on the first impurity region 120. In example embodiments, a plurality of the diodes 150 may be formed in the first and second directions. Each of the diodes 150 may function as the switching device of the phase change memory device.

In example embodiments, an ohmic pattern (not illustrated) including a metal silicide may be further formed by conducting a silicidation process on each of the diodes 150.

Figure 4:
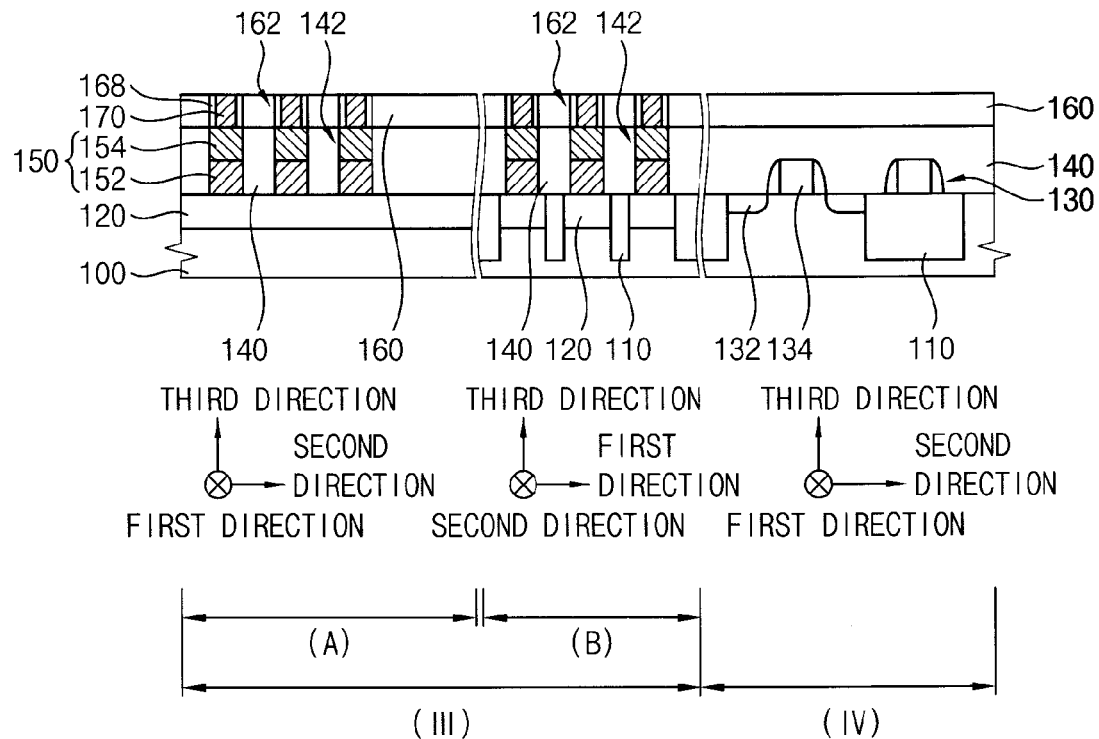

Referring to FIG. 4, a second insulating interlayer 160 may be formed on the first insulating interlayer 140 and the diode 150, and a lower electrode 170 and a spacer 168 may be formed to penetrate the second insulating interlayer 160.

The second insulating interlayer 160 may be formed using substantially the same or similar material as the first insulating interlayer 140. In at least one example embodiment, the second insulating interlayer 160 may be formed using silicon oxide.

A plurality of second holes 162 exposing the upper surface of each of the diodes 150 may be formed by partially etching the second insulating interlayer 160, a spacer layer may be formed on the upper surface of the exposed diodes 150, on the side wall of the second holes 162 and on the second insulating interlayer 160, and the spacer layer may be anisotropically etched to form the spacer 168 on the side wall of the second holes 162. In at least one example embodiment, the spacer layer may be formed using silicon nitride.

The lower electrode 170 may be formed by forming a lower electrode layer filling up the remaining portion of the second holes 162 on the upper surface of the exposed diodes 150 and on the second insulating interlayer, and planarizing the lower electrode layer until the upper surface of the second insulating interlayer 160 may be exposed. For example, the lower electrode 170 may have an upper surface that is substantially coplanar with (or at a substantially same level as) an upper surface of the second insulating interlayer 160.

Particularly, the lower electrode layer may be formed using a metal nitride or a metal silicon nitride such as titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), zirconium silicon nitride (ZrSiN), etc., through an ALD process, a PVD process, a sputtering process, etc.

Through forming the spacer 168, a contact area between the lower electrode 170 and the phase change material layer pattern 225 (see FIG. 12) may decrease, and a heating efficiency of the phase change material layer pattern 225 may increase. However, it should be understood that the spacer 168 may be omitted if desired.

Figure 5:
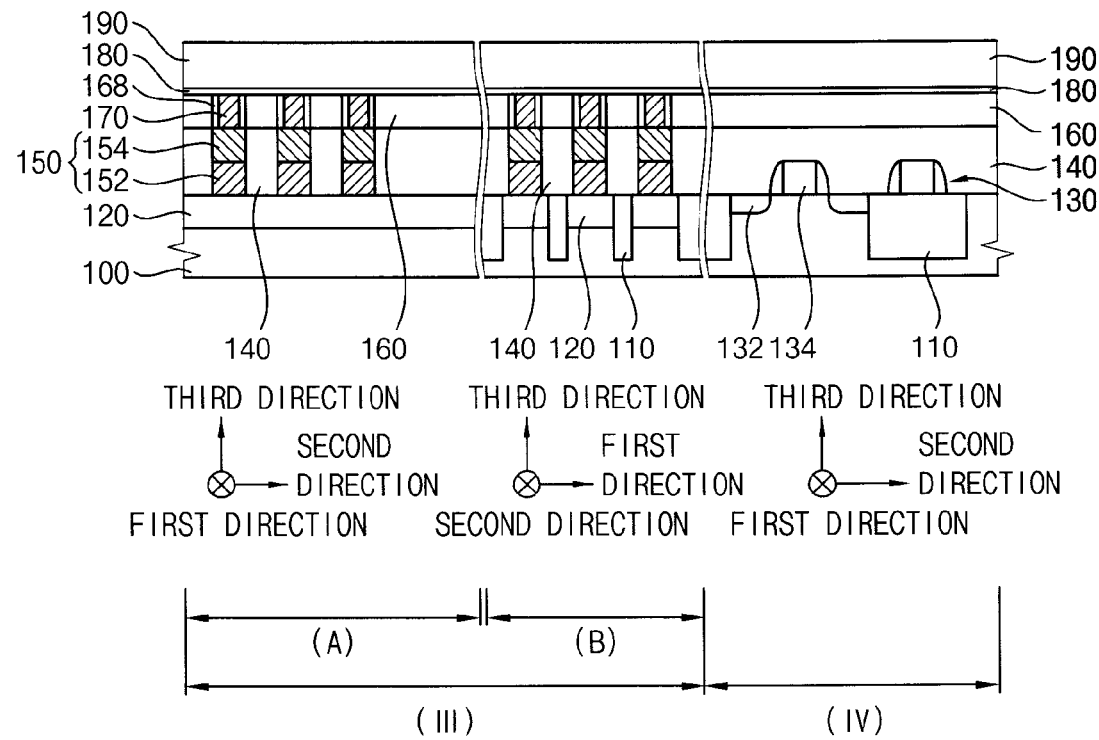

Referring to FIG. 5, a first etch stopping layer 180 and a third insulating interlayer 190 may be sequentially formed on the second insulating interlayer 160, the lower electrode 170 and the spacer 168.

The first etch stopping layer 180 may be formed using a material having an etching selectivity with respect to a material forming the third insulating interlayer 190. For example, the first etch stopping layer 180 may be formed using an insulating material such as silicon oxide (SiO), silicon nitride (SiN), silicon oxynitride (SiON), silicon carbide (SiC), titanium oxide (TiO), zirconium oxide (ZrO), magnesium oxide (MgO), hafnium oxide (HfO), aluminum oxide (AlO), through an ALD process, a CVD process, a PVD process, etc. In example embodiments, the first etch stopping layer 180 may be formed using silicon nitride, when the second insulating interlayer 160 includes silicon oxide.

Then, the third insulating interlayer 190 may be formed using substantially the same or similar material as the first insulating interlayer 140 or the second insulating interlayer 160 through substantially the same or similar process. In at least one example embodiment, the third insulating interlayer 190 may be formed using silicon oxide.

Referring to FIG. 6, first to third contacts 192, 194 and 196 penetrating the first to third insulating interlayers 140, 160 and 190, and the first etch stopping layer 180 may be formed.

In at least one example embodiment, the first to third contacts 192, 194 and 196 may be formed by forming first to third contact holes 182, 184 and 186 to expose the first impurity region 120, the second impurity region 132 and the gate structure 134. The first to third contacts 192, 194, and 196 may be formed by partially removing the first to third insulating interlayers 140, 160 and 190 and the first etch stopping layer 180, forming a conductive layer filling the first to third contact holes 182, 184 and 186 on the exposed first impurity region 120, the second impurity region 132 and the gate structure 134 and on the third insulating interlayer 190, and then removing the upper portion of the conductive layer until the upper surface of the third insulating interlayer 190 is exposed.

Accordingly, the first contact 192 may have an electric connection with the first impurity region 120, the second contact 194 may have an electric connection with the second impurity region 132, and the third contact 196 may have a contact with the gate structure 134.

Referring to FIG. 7, a second etch stopping layer 200 may be formed on the third insulating interlayer 190, and the second and third contacts 194 and 196.

The second etch stopping layer 200 may be formed using substantially the same or similar material as the first etch stopping layer 180 through substantially the same or similar process. In at least one example embodiment, the second etch stopping layer 200 may sufficiently cover the third insulating interlayer 190 and the second and third contacts 194 and 196 in the peripheral circuit region (IV). In addition, a plurality of the second etch stopping layers 200 may be formed in the first direction, and each of the second etch stopping layers 200 may be extended in the second direction in the cell region (III). Thus, the second etch stopping layer 200 may be disposed so as to not overlap with the lower electrode 170 in the cell region (III).

Figure 8:
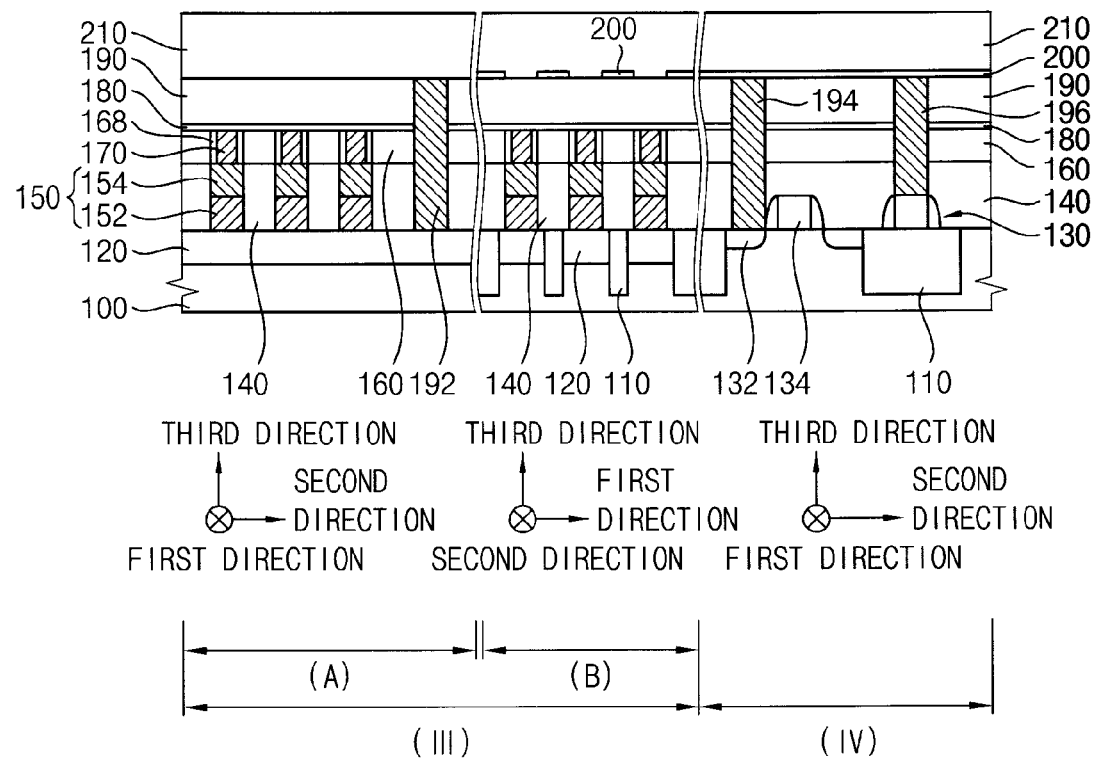

Referring to FIG. 8, a fourth insulating interlayer 210 may be formed on the third insulating interlayer 190, the first contact 192 and the second etch stopping layer 200.

In example embodiments, the fourth insulating interlayer 210 may be formed using substantially the same or similar material as the third insulating interlayer 190 through substantially the same or similar process. Thus, an etching selectivity may be present between the material forming the second etch stopping layer 200 and the material forming the fourth insulating interlayer 210.

Figure 9:
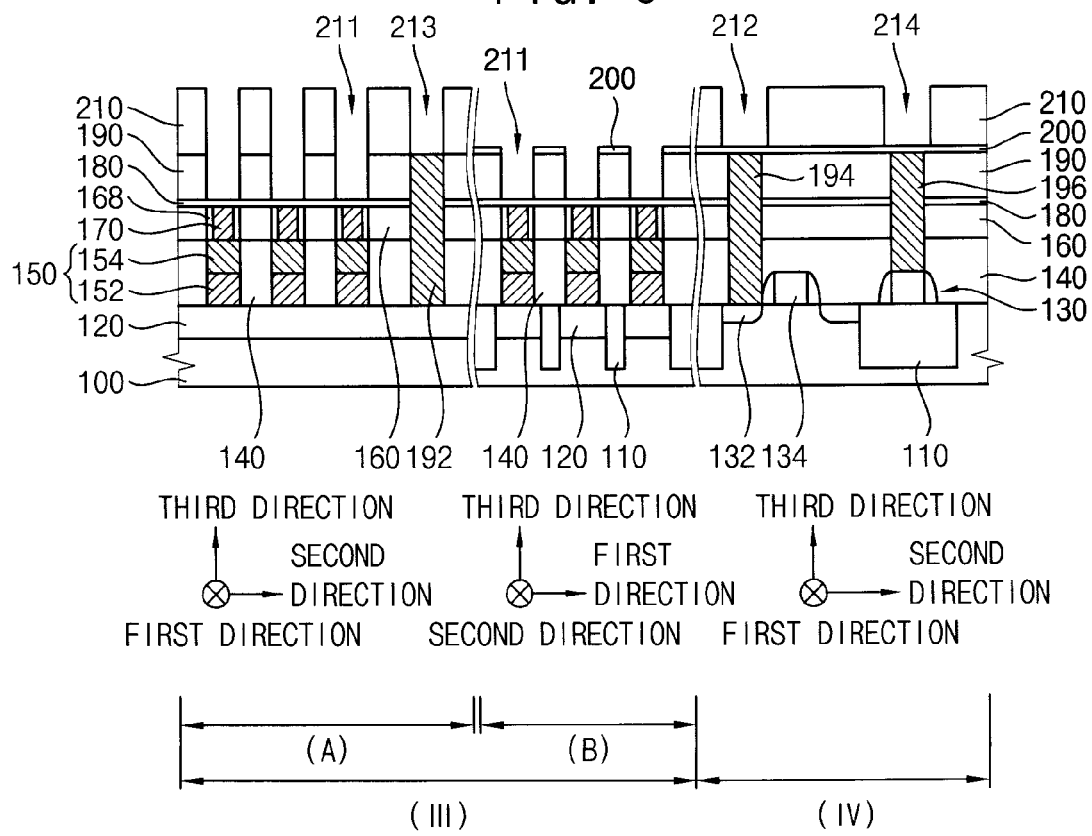

Referring to FIG. 9, first to fourth openings 211, 212, 213 and 214 may be formed by partially etching the third insulating interlayer 190 and/or the fourth insulating interlayer 210.

The etching process may be conducted by using a photoresist pattern formed using an argon fluoride-iodine (ArF—I) light source. A photoresist layer may be formed on the fourth insulating interlayer 210. The photoresist layer may be exposed to the ArF—I light source, and may be developed to form the photoresist pattern. Then, the third and fourth insulating interlayers 190 and 210 may be etched by using the photoresist pattern as an etching mask. Particularly, a plurality of the photoresist patterns may be formed in the second direction, and each of the photoresist patterns may be extended in the first direction.

In this case, the first opening 211 may be formed in the cell region (III) to expose the first etch stopping layer 180 formed on the lower electrode 170 and the spacer 168. The second and fourth openings 212 and 214 may be formed in the peripheral circuit region (IV) to expose the second etch stopping layer 200 formed on the second contact 194 and the third contact 196. The third opening 213 may be formed to expose the first contact 192. Accordingly, the first opening 211 penetrating the third and fourth insulating interlayers 190 and 210 may have a greater depth than those of the second to fourth openings 212, 213 and 214 penetrating the fourth insulating interlayer 210. Thus, a step may be formed between the first opening 211 forming in the cell region (III) and the second and fourth openings 212 and 214 formed in the peripheral circuit region (IV). In other words, an upper surface of the first contact 192 and an upper surface of the second contact 194 may be substantially coplanar with (or at a substantially same level as) an upper surface of the third insulating interlayer 190.

The first to fourth openings 211, 212, 213 and 214 may be formed to be narrowed from the upper portion to the lower portion thereof due to the characteristic of an etching process.

Figure 10:
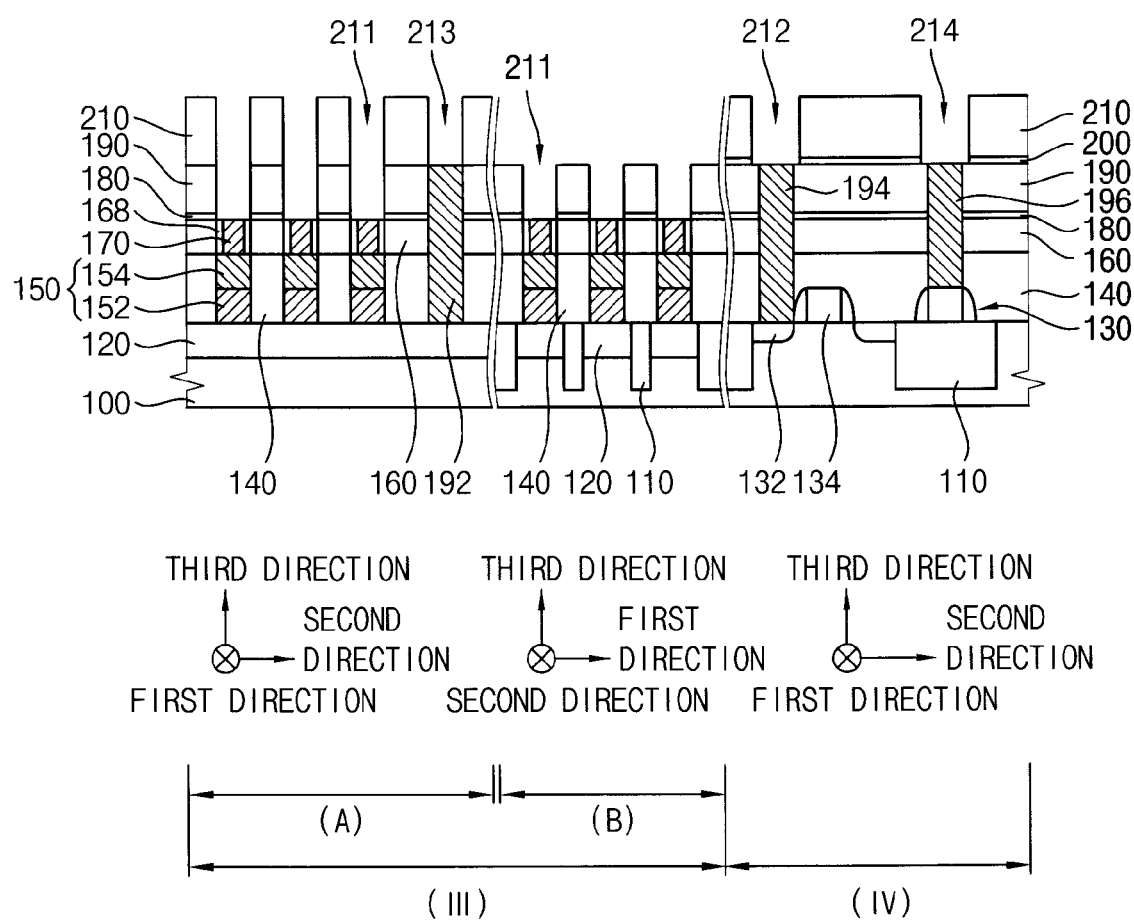

Referring to FIG. 10, the first and second etch stopping layers 180 and 200 exposed by the first to fourth openings 211, 212, 213 and 214 may be removed.

Through removing the first etch stopping layer 180 exposed by the first opening 211, the lower electrode 170 and the spacer 168 may be exposed. Through removing the second etch stopping layer 200 exposed by the second and fourth openings 212 and 214, the second and third contacts 194 and 196 may be exposed, respectively.

Figure 11:
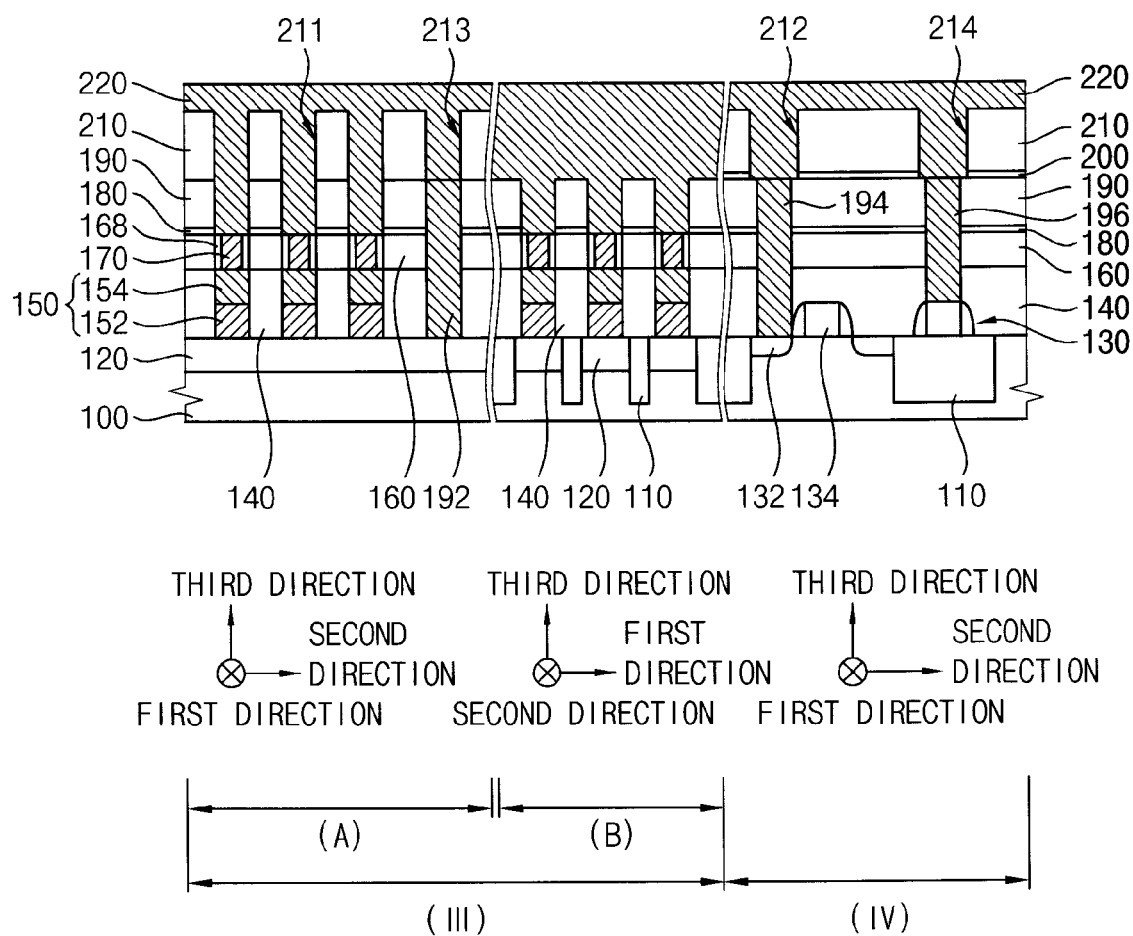

Referring to FIG. 11, a phase change material layer 220 filling up the first to fourth openings 211, 212, 213 and 214 may be formed on the exposed lower electrode 170, the spacer 168, the first to third contacts 192, 194 and 196, and the third and fourth insulating interlayers 190 and 210.

In at least one example embodiment, the phase change material layer 220 may be formed using a chalcogenide compound, or carbon (C), nitrogen (N) and/or a metal doped chalcogenide compound through a CVD process, an ALD process, etc. The chalcogenide compound may include GeSbSe, SbSe, GeSbTe, SbTe, GeSb, AsSbTe, SnSbTe, SnInSbTe, etc.

Since the depth of the first opening 211 may be greater than the depth of the second to fourth openings 212, 213 and 214, the height of a portion of the phase change material layer 220 filling up the first opening 211 may be greater than the heights of portions of the phase change material layer filling up the second to fourth openings 212, 213 and 214.

Figure 12:
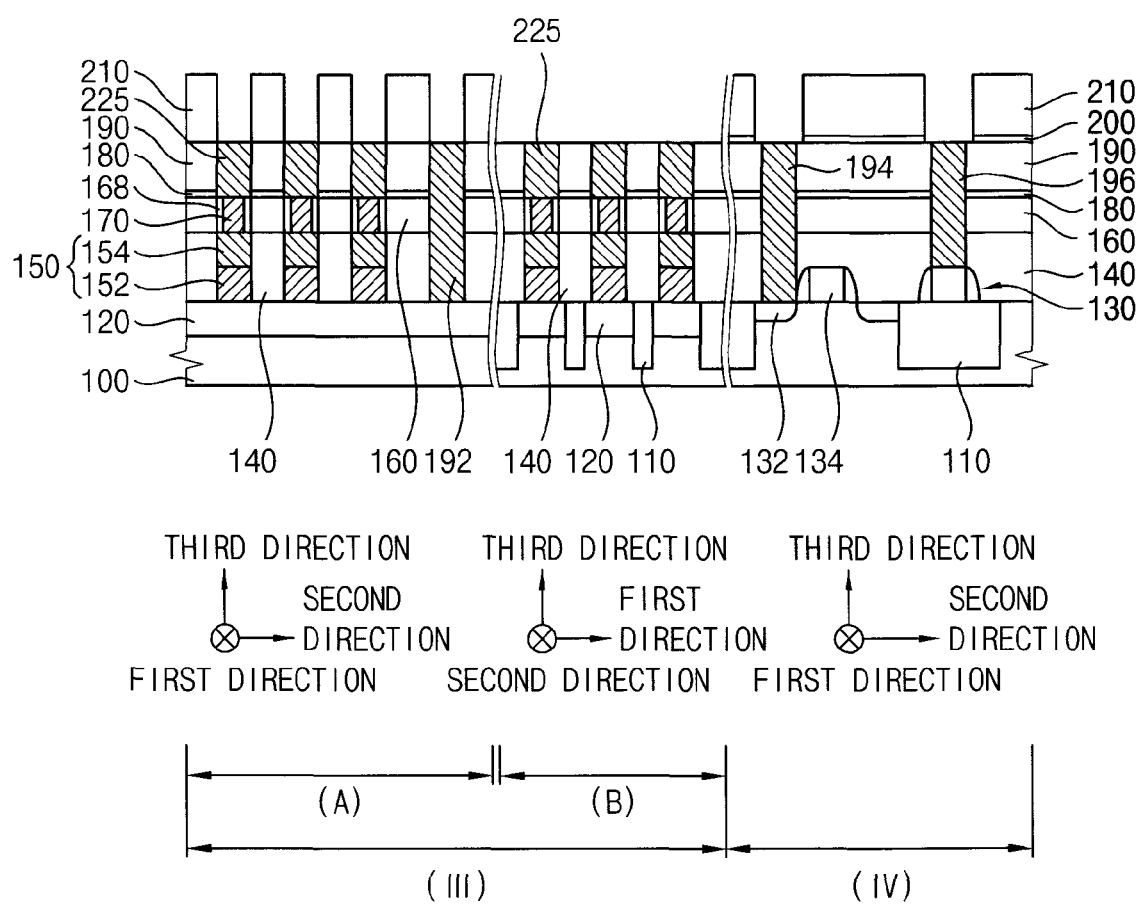

Referring to FIG. 12, the phase change material layer 220 may be partially removed to form a phase change material layer pattern 225.

In at least one example embodiment, the phase change material layer pattern 225 may be formed by partially removing the phase change material layer 220 through an etch back process. Since the height of the portion of the phase change material layer 220 filling up the first opening 211 may be greater than the heights of the portions of the phase change material layer 220 filling up the second to fourth openings 212, 213 and 214, the portions of the phase change material layer 220 filling up the second to fourth openings 212, 213 and 214 may be removed sufficiently by conducting the etch back process. However, the portion of the phase change material layer 220 filling up the first opening 211 may remain partially to form the phase change material layer pattern 225. Thus, the phase change material layer pattern 225 partially filling up the first opening 211 may be formed on the lower electrode 170 and the spacer 168.

As described above, an upper surface of phase change material layer pattern 225 may be substantially coplanar with (or at a substantially same level as) an upper surface of each of the first and second contacts 192 and 194. Thus, the phase change material layer pattern 225 may be formed only in the cell region (III) without conducting a separate patterning process in the cell region (III) and the peripheral circuit region (IV), respectively. Referring to FIG. 13, a bit line 250 filling up the remaining portion of the first opening 211 may be formed on the phase change material layer pattern 225, and first and second wirings 254 and 256 may be formed on the second and third contacts 194 and 196, respectively. In addition, a word line contact 252 may be formed on the first contact 192.

Particularly, a barrier layer and a conductive layer may be formed one by one on the upper surface of the phase change material layer pattern 225, on the upper surface of the first to third contacts 192, 194 and 196, and on the side wall and the upper surface of the fourth insulating interlayer 210. Then, the upper portion of the barrier layer and the conductive layer may be removed by a CMP process and/or an etch-back process to form the bit line 250, the first wiring 254, the word line contact 252 and the second wiring 256. The bit line 250 may include a first barrier layer pattern 230 formed on the side wall and the bottom surface of the first opening 211 and a first conductive pattern 240 filling up the remaining portion of the first opening 211, the first wiring 254 may include a second barrier layer pattern 234 formed at the side wall and the bottom surface of the second opening 212 and a second conductive pattern 244 filling up the remaining portion of the second opening 212, the word line contact 252 may include a third barrier layer pattern 232 formed at the side wall and the bottom surface of the third opening 213 and a third conductive pattern 242 filling up the remaining portion of the third opening 213, and the second wiring 256 may include a fourth barrier layer pattern 236 formed at the side wall and the bottom surface of the fourth opening 214 and a fourth conductive pattern 246 filling up the remaining portion of the fourth opening 214.

Accordingly, an upper surface of the bit line 250 may be substantially coplanar with (or at a substantially same level as) an upper surface of the fourth insulating interlayer 210. Similarly, the word line contact 252 may be formed on the first contact 192 such that an upper surface of the word line contact 252 is substantially coplanar with (or at a substantially same levels as) an upper surface of the fourth insulating interlayer 210.

The barrier layer may be formed using a metal or a metal nitride by means of a CVD process or an ALD process. In at least one example embodiment, the barrier layer may be formed using tantalum or tantalum nitride.

The conductive layer may be formed using copper (Cu), tungsten (W), titanium (Ti), tantalum (Ta), ruthenium (Ru), aluminum (Al) or an alloy thereof. In at least one example embodiment, the conductive layer may be formed using Cu.

Accordingly, the phase change material layer pattern 225 and the bit line 250 may be formed within the same first opening 211. Thus, the bit line 250 may be self-aligned with the phase change material layer pattern 225. In addition, since the bit line 250 in the cell region (III) and the first and second wirings 254 and 256 in the peripheral circuit region (IV) may be formed at the same time, the process may be simplified. In addition, the forming process of the upper electrode between the phase change material layer pattern 225 and the bit line 250 may be omitted. Thus, the process may be further simplified.

Figure 14:
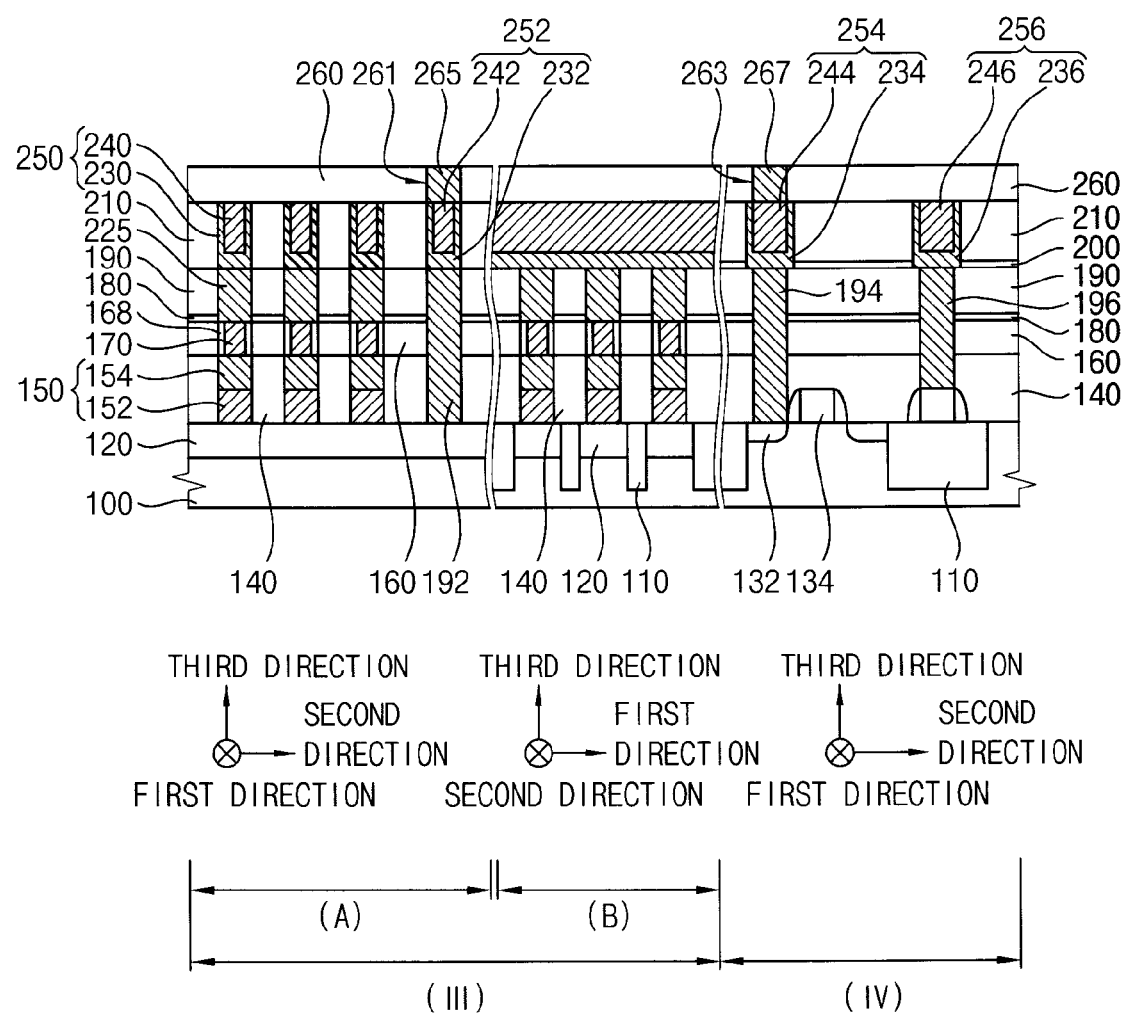

Referring to FIG. 14, a fifth insulating interlayer 260 may be formed on the fourth insulating interlayer 210, the bit line 250, the word line contact 252 and the first and second wirings 254 and 256, and fourth and fifth contacts 265 and 267 may be formed to penetrate the fifth insulating interlayer 260.

The fifth insulating interlayer 260 may be formed using an insulating material such as silicon oxide. Then, the fifth insulating layer 260 may be partially removed to form a fourth contact hole 261 exposing the word line contact 252 and a fifth contact hole 263 exposing the first wiring 254, simultaneously. Then, a conductive layer filling up the whole fourth contact hole 261 and the fifth contact hole 263 may be formed. The upper portion of the conductive layer may be removed to form a fourth contact 265 and a fifth contact 267.

Referring to FIG. 15, a fifth conductive pattern 270 and a third wiring 275 may be formed on the fifth insulating interlayer 260 and the fourth and fifth contacts 265 and 267, and a passivation layer 280 covering the fifth conductive pattern 270 and the third wiring 275 may be formed.

In at least one example embodiment, the fifth conductive pattern 270 may be formed to have an electric connection with the fourth contact 265, and the third wiring 275 may be formed to have an electric connection with the fifth contact 267. The fifth conductive pattern 270 may function as a strapping word line (SWL) of the phase change memory device.

FIGS. 16 to 19 are cross-sectional views for explaining a method of manufacturing a phase change memory device in accordance with at least one other example embodiment. For the convenience of explanation, the cross-section A taken along a line I-I' in FIG. 1 and the cross-section B taken along a line II-II' in FIG. 1 are illustrated together in FIGS. 16 to 19. In addition, the cross-section of the cell region (III) for disposing phase change memory cells and the cross-section of the peripheral circuit region (IV) for disposing peripheral circuits are illustrated together in FIGS. 16 to 19. The method of manufacturing the phase change memory device may include substantially the same or similar processes as the processes included in the method of manufacturing the phase change memory device explained referring to FIGS. 2 to 15. Thus, the same reference numeral may be designated for the same constituting elements, and explanation on the elements will be omitted.

First, substantially the same or similar processes as the processes explained referring to FIGS. 2 to 8 may be conducted. In this case, the formation of the spacer surrounding the side wall of a lower electrode 170 may be omitted.

Figure 16:
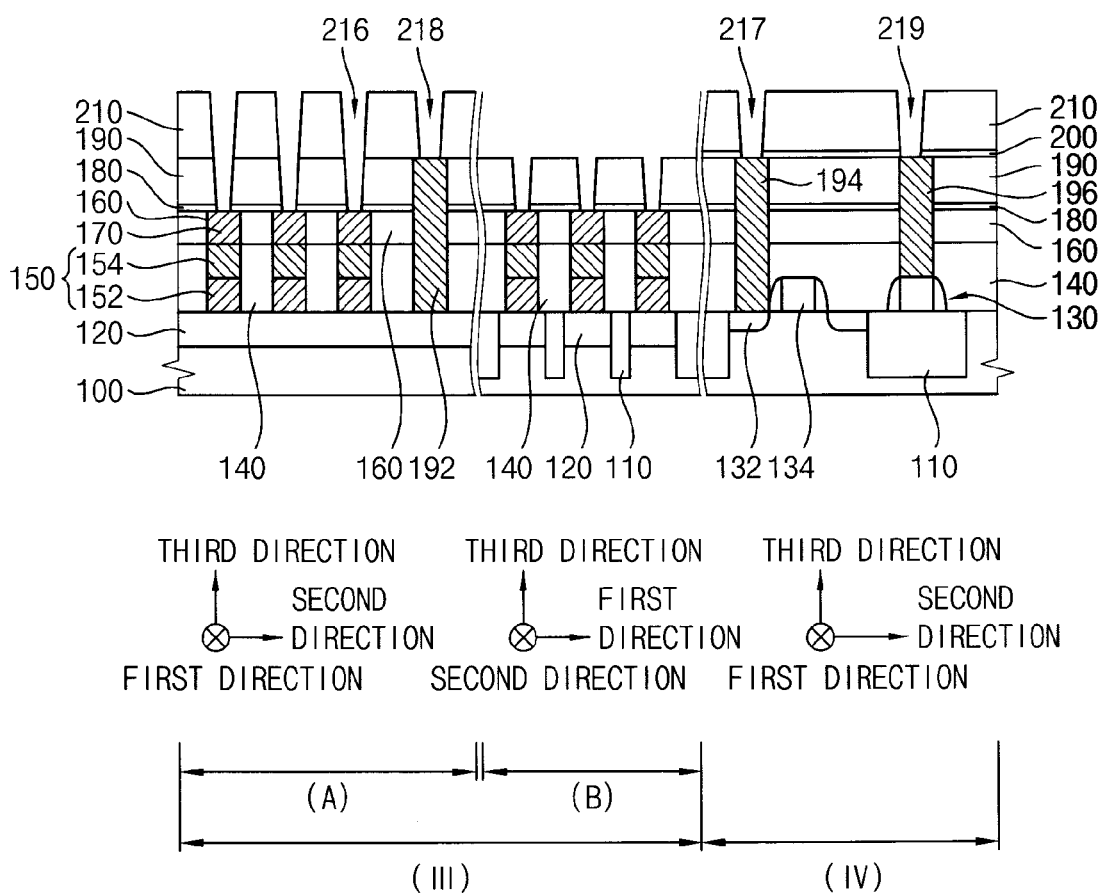

Referring to FIG. 16, substantially the same or similar processes as the processes explained referring to FIGS. 9 and 10 may be conducted to form fifth to eighth openings 216, 217, 218 and 219. Accordingly, the lower electrode 170, a second contact 194, a first contact 192 and a third contact 196 may be exposed by the fifth to eighth openings 216, 217, 218 and 219, respectively. The fifth to eighth openings 216, 217, 218 and 219 may be narrowed from the upper portion to the lower portion thereof according to the characteristic of an etching process.

Figure 17:
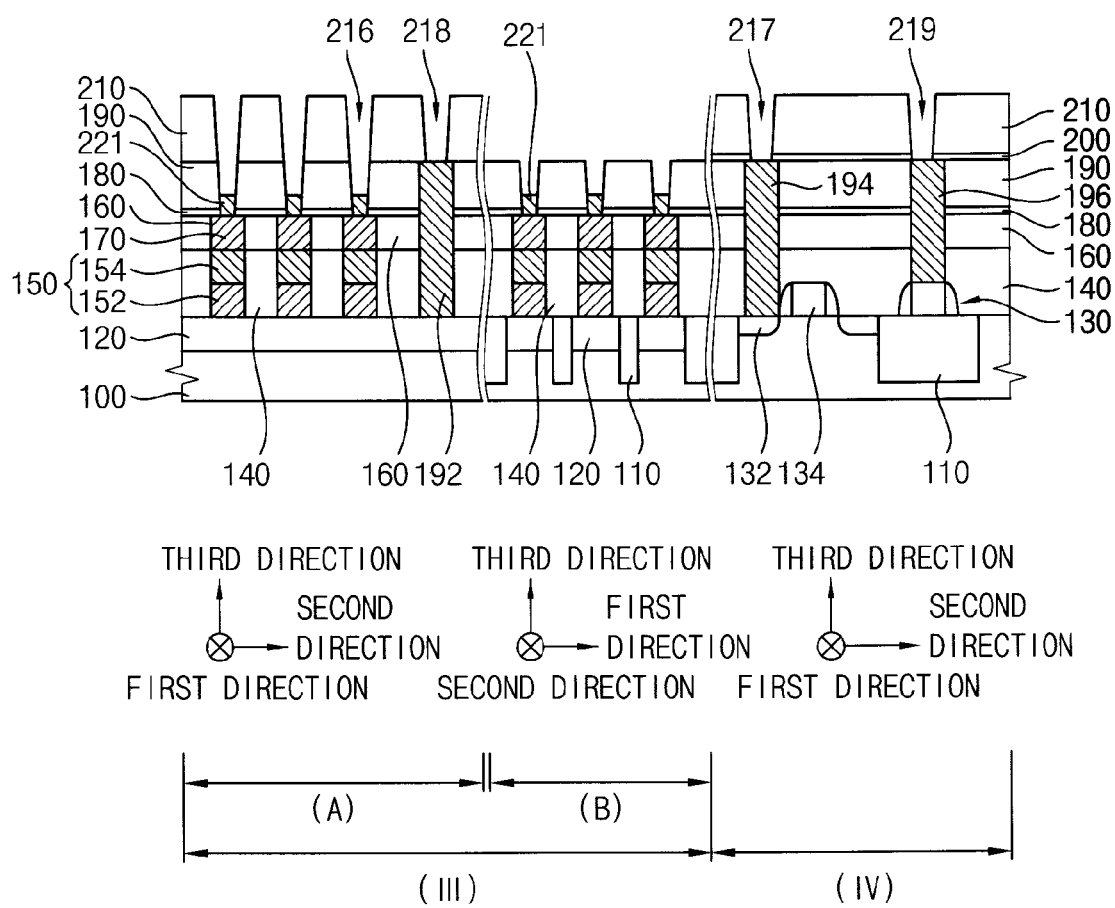

Referring to FIG. 17, a lower phase change material layer pattern 221 partially filling up the fifth opening 216 may be formed.

Particularly, after forming the lower phase change material layer filling up the firth to eighth openings 216, 217, 218 and 219 on a fourth insulating interlayer 210, the lower phase change material layer may be partially removed to form the lower phase change material layer pattern 221. In this case, portions of the lower phase change material layer in the sixth to eighth openings 217, 218 and 219 may be removed sufficiently.

The lower phase change material layer pattern 221 may be formed using a chalcogenide compound, or a carbon, nitrogen and/or a metal doped chalcogenide compound, by means of a CVD process, an ALD process, etc. In at least one example embodiment, the lower phase change material layer pattern 221 may be formed using a material having a resistance lower than about 500 kΩ. Particularly, the lower phase change material layer pattern 221 may include SbTe.

Figure 18:
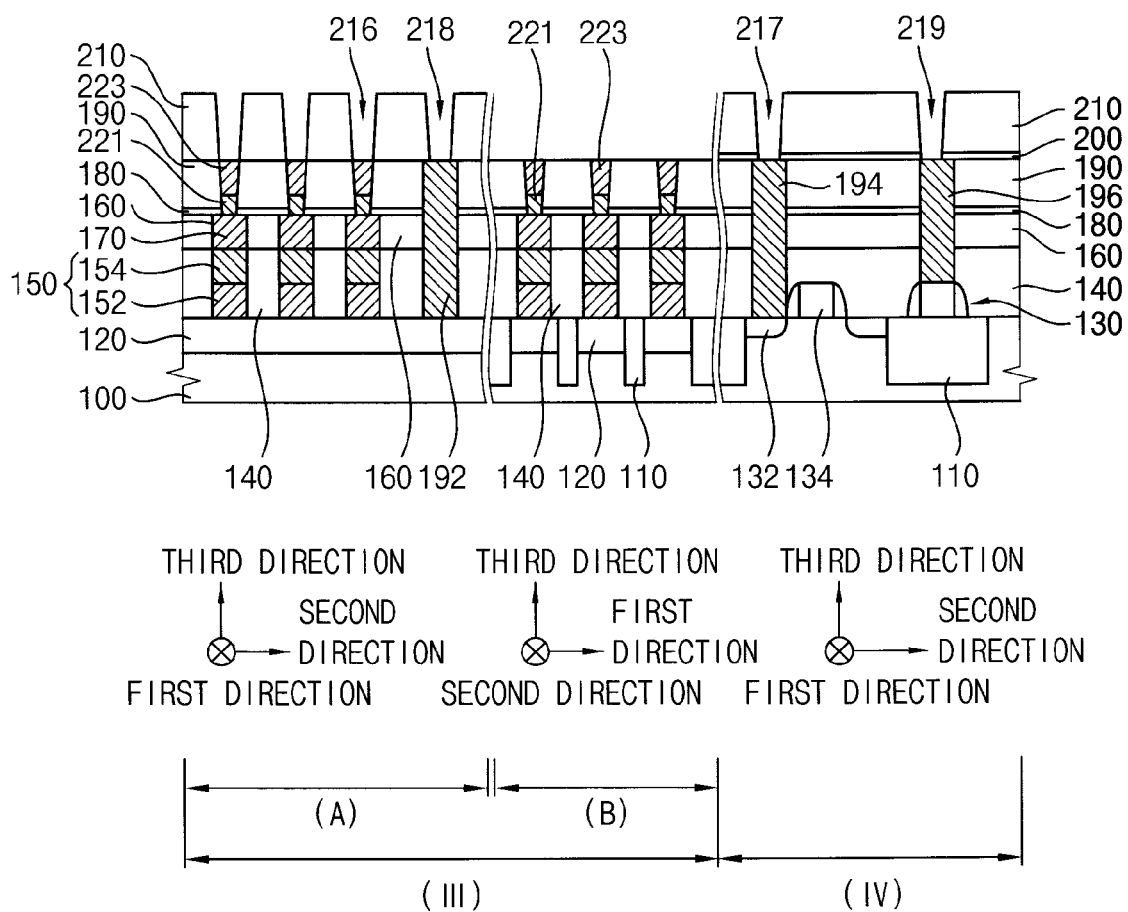

Referring to FIG. 18, an upper phase change material layer pattern 223 partially filling up the remaining portion of the fifth opening 216 may be formed.

Particularly, after forming the upper phase change material layer filling up the fifth to eighth openings 216, 217, 218 and 219 on the lower phase change material layer pattern 221, the upper phase change material layer in the fifth opening 216 may be partially removed to form an upper phase change material layer pattern 223. In this case, portions of the upper phase change material layer in the sixth to eighth openings 217, 218 and 219 may be removed sufficiently.

The upper phase change material layer pattern 223 may be formed using a chalcogenide compound or a carbon, nitrogen and/or metal doped chalcogenide compound by means of a CVD process, an ALD process etc. In at least one example embodiments, the upper phase change material layer pattern 223 may be formed using a material having a resistance of about 1 MΩ or more. Particularly, the upper phase change material layer pattern 223 may include GeSbTe, GeBiTe, carbon (C) or nitrogen (N) doped GeSbTe, etc.

In this case, the lower phase change material layer pattern 221 and the upper phase change material layer pattern 223 may include different materials to obtain a remarkable resistance distribution between the lower phase change material layer pattern 221 and the upper phase change material layer pattern 223, while programming for storing data in the phase change memory device. That is, the resistance value at the amorphous state of the upper phase change material layer pattern 223 may be greater than the resistance value at the amorphous state of the lower phase change material layer pattern 221.

In addition, the lower phase change material layer pattern 221 and the upper phase change material layer pattern 223 may have different volumes to obtain the remarkable resistance distributions between the lower phase change material layer pattern 221 and the upper phase change material layer pattern 223 while programming for storing data in the phase change memory device. Particularly, the volume of the upper phase change material layer pattern 223 may be greater than the volume of the lower phase change material layer pattern 221. Accordingly, the size of the amorphous region of the upper phase change material layer pattern 223 may be variable, and the storage capacity of a unit cell may be increased. At last, the phase change memory device may accomplish a multi-level cell (MLC).

Referring to FIG. 19, substantially the same or similar processes as explained referring to FIG. 13 may be conducted. Accordingly, a bit line 250 filling up the remaining portion of the fifth opening 216 may be formed, first and second wirings 254 and 256 may be respectively formed on the second and third contacts 194 and 196, and a word line contact 252 may be formed on the first contact 192.

Since the lower phase change material layer pattern 221, the upper phase change material layer pattern 223 and the bit line 250 may be formed in the same fifth opening 216, the bit line 250 may be self-aligned with the lower phase change material layer pattern 221 and the upper phase change material layer pattern 223. In addition, the bit line 250 formed in the cell region (III) and the first and second wirings 254 and 256 formed in the peripheral circuit region (IV) may be formed simultaneously. Thus, the manufacturing process may be simplified. In addition, since the forming process of the upper electrode between the phase change material layer pattern 225 and the bit line 250 may be omitted, the manufacturing process may be further simplified.

Then, substantially the same or similar processes as the processes explained referring to FIGS. 14 and 15 may be conducted to complete the phase change memory device.

Figure 20:
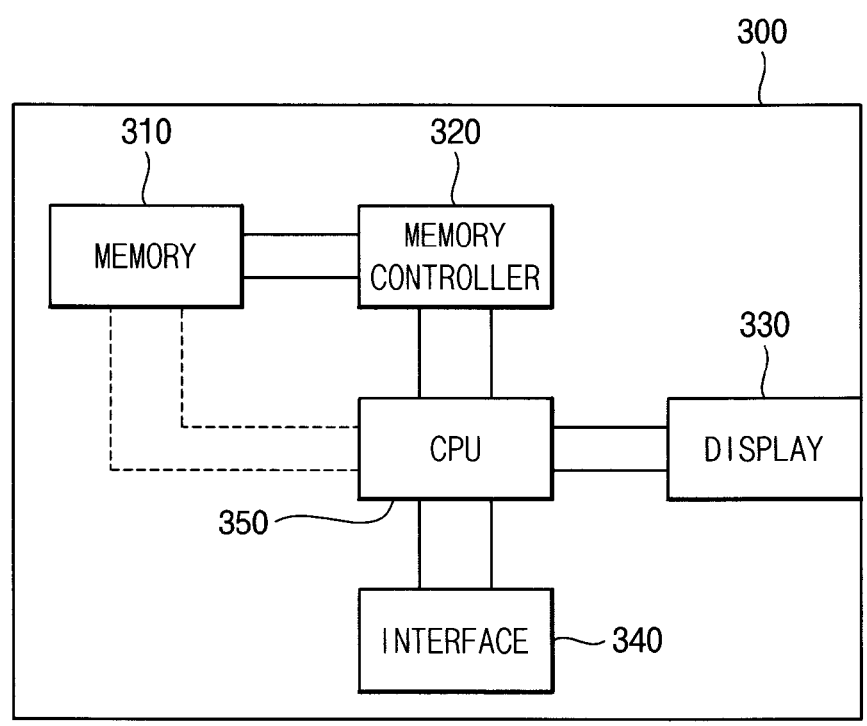

FIG. 20 is a block diagram for explaining a system 300 including a phase change memory device in accordance with example embodiments.

Referring to FIG. 20, the system 300 may include a memory 310, a memory controller 320 for controlling the operation of the memory 310, a displaying part 330 for outputting information, an interface for receiving information and a main processor 350 for controlling the above-described parts. The memory 310 may be the phase change memory device in example embodiments. The memory 310 may be connected directly to the main processor 350 or via bus, etc. The system 300 may be applied in a computer, a portable computer, a laptop computer, a personal portable terminal, a tablet, a cellular phone, a digital music player, etc.

In accordance with the method of manufacturing the phase change memory device in example embodiments, a bit line self-aligned with a phase change material layer pattern may be formed by a simplified process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a phase change memory device, comprising:
    forming a lower electrode in a cell region of a substrate and a transistor in a peripheral circuit region of the substrate;
    forming a first insulating interlayer on the substrate, the first insulating interlayer covering the lower electrode and the transistor;
    forming a first contact in the peripheral circuit region, the first contact penetrating through the first insulating interlayer to make an electric connection with the transistor;
    forming a second insulating interlayer on the first insulating interlayer and the first contact;
    forming a first opening and a second opening by partially removing the first and second insulating interlayers, the first opening exposing the lower electrode and the second opening exposing the first contact;
    forming a phase change material layer to fill the first and second openings;
    partially removing the phase change material layer to form a phase change material layer pattern partially filling the first opening; and
    forming a bit line and a wiring, the bit line filling a remaining portion of the first opening, and the wiring filling the second opening.

2. The method of claim 1, wherein the bit line is formed to extend in a first direction parallel to an upper surface of the substrate.

3. The method of claim 2, further comprising:
    forming a word line extending in a second direction in the cell region of the substrate, the second direction being perpendicular to the first direction.

4. The method of claim 3, wherein the forming a first contact further comprises forming a second contact through the first insulating interlayer to make an electric connection with the word line in the cell region of the substrate.

5. The method of claim 4, wherein,
    the forming a first opening further comprises forming a third opening exposing the second contact,
    the forming a phase change material layer further comprises forming the phase change material layer to fill the third opening, and
    the forming a bit line and the wiring further comprises forming a word line contact to fill the third opening.

6. The method of claim 1, wherein the partially removing the phase change material layer includes partially removing a portion of the phase change material layer which fills the first opening, and removing portions of the phase change material layer which fills the second opening.

7. The method of claim 1, wherein the partially removing the phase change material layer includes an etch back process.

8. The method of claim 1, wherein the forming a bit line and a wiring comprises:

forming a first barrier layer on the phase change material layer pattern, the first contact, side walls of the first and second openings, and the second insulating interlayer;

forming a first conductive layer on the first barrier layer, the first conductive layer filling a remaining portion of the first and second openings; and planarizing the first conductive layer and the first barrier layer until the upper surface of the second insulating interlayer is exposed to form a first barrier layer pattern and a first conductive pattern partially filling up the first opening, and to form a second barrier layer pattern and a second conductive pattern filling up the second opening.

9. The method of claim 1, wherein the bit line directly contacts the phase change material layer pattern.

10. The method of claim 1, further comprising:
forming an etch stopping layer on the first insulating interlayer after forming the first insulating interlayer.

11. The method of claim 1, further comprising:
forming a diode in the cell region of the substrate before forming the lower electrode, wherein the lower electrode is formed on the diode.

12. The method of claim 1, wherein the phase change material layer pattern is self-aligned with the bit line.

13. A method of manufacturing a phase change memory device, comprising:
forming a lower electrode in a cell region of a substrate and a transistor in a peripheral circuit region of the substrate;
forming a first insulating interlayer on the substrate, the first insulating interlayer covering the lower electrode and the transistor;
forming a first contact in the peripheral circuit region, the first contact penetrating through the first insulating interlayer to make an electric connection with the transistor;
forming a second insulating interlayer on the first insulating interlayer and the first contact;
forming a first opening and a second opening by partially removing the first and second insulating interlayers, the first opening exposing the lower electrode and the second opening exposing the first contact;
forming a lower phase change material layer filling up the first and second openings;
forming a lower phase change material layer pattern by partially removing the lower phase change material layer, the lower phase change material layer pattern partially filling up the first opening;
forming an upper phase change material layer filling up the first and second openings;
forming an upper phase change material layer pattern by partially removing the upper phase change material layer, the upper phase change material layer pattern partially filling up the first opening; and
forming a bit line and a wiring, the bit line filling up a remaining portion of the first opening, and the wiring filling up the second opening.

14. The method of claim 13, further comprising:
forming a word line in the cell region, the word line extending in a first direction that is in parallel with an upper surface of the substrate,
wherein the bit line is formed to extend in a second direction that is perpendicular to the first direction.

15. The method of claim 13, wherein,
the forming a first contact further comprises forming a second contact through the first insulating interlayer to make an electric connection with the word line,
the forming a first opening and a second opening further comprises forming a third opening exposing the second contact,
the forming a lower phase change material layer further comprises forming the lower phase change material layer to fill the third opening, and
the forming a bit line and a wiring further comprises forming a word line contact to fill the third opening.

16. A method of manufacturing a phase change memory device, comprising:
forming a first insulating interlayer on a substrate;
forming at least one lower electrode in the first insulating interlayer;
forming a second insulating interlayer on the first insulating interlayer and the at least one lower electrode;
forming at least one contact through the first and second insulating interlayers;
forming a third insulating interlayer on the second insulating interlayer and the at least one contact;
forming first and second openings through the second and third insulating interlayers, the first opening exposing the at least one lower electrode and the second opening exposing the at least one contact;
forming at least one phase change material on the at least one lower electrode; and
forming at least one bit line and at least one wiring, the at least one bit line being in the first opening, and the at least one wiring being in the second opening.

17. The method of claim 16, wherein the forming at least one phase change material includes,
forming a lower phase change material in a lower portion of the first opening, and
forming an upper phase change material on the lower phase change material, the upper phase change material having higher resistance than the lower phase change material.

18. The method of claim 17, wherein the forming first and second openings includes forming the first and second openings to have inclined sidewalls.

19. The method of claim 17, wherein,
the forming at least one lower electrode includes forming the at least one lower electrode in the first insulating interlayer such that the at least one lower electrode has an upper surface substantially coplanar with an upper surface of the first insulating interlayer,
the forming at least one contact includes forming the at least one contact such that an upper surface of the at least one contact is substantially coplanar with an upper surface of the second insulating interlayer, and
the forming at least one phase change material includes forming the at least one phase change material such that the at least one phase change material has an upper surface substantially coplanar with the upper surface of the at least one contact.

20. The method of claim 17, further comprising:
forming at least one word line contact on the at least one contact such that an upper surface of the at least one word line contact is substantially coplanar with the upper surface of the third insulating interlayer, wherein the forming at least one bit line and at least one wiring includes forming the at least one bit line and the at least one wiring such that an upper surface of the at least one bit line and the at least one wiring is substantially coplanar with an upper surface of the third insulating interlayer.

* * * * *